(12) United States Patent
Woo et al.

(10) Patent No.: US 6,983,132 B2
(45) Date of Patent: Jan. 3, 2006

(54) MULTI-BAND RF RECEIVING METHOD AND APPARATUS IN MOBILE COMMUNICATION SYSTEM

(75) Inventors: Sang-hyun Woo, Seoul (KR); Seong-soo Lee, Suwon (KR); Jong-ae Park, Yongin (KR)

(73) Assignee: Samsung Electronics Co., Ltd., Suwon (KR)

( * ) Notice: Subject to any disclaimer, the term of this patent is extended or adjusted under 35 U.S.C. 154(b) by 222 days.

(21) Appl. No.: 10/616,043

(22) Filed: Jul. 10, 2003

(65) Prior Publication Data

US 2004/0014435 A1    Jan. 22, 2004

(30) Foreign Application Priority Data

Jul. 20, 2002    (KR) ............................... 2002-40672

(51) Int. Cl.
*H04B 1/02*    (2006.01)
*H04B 1/04*    (2006.01)
(52) U.S. Cl. .................................................... 455/103
(58) Field of Classification Search ................ 455/103, 455/126, 127.2
See application file for complete search history.

(56) References Cited

U.S. PATENT DOCUMENTS

| 5,930,686 A | 7/1999 | Devlin et al. |
| 6,014,571 A | 1/2000 | Enoki .......................... 455/550 |
| 2004/0014435 A1 * | 1/2004 | Woo et al. ................... 455/103 |

FOREIGN PATENT DOCUMENTS

| EP | 0 800 283 A2 | 10/1997 |
| EP | 0 800 283 A3 | 10/1997 |
| EP | 0 923 198 A2 | 6/1999 |
| EP | 0 923 198 A3 | 9/1999 |
| EP | 1 006 669 A1 | 6/2000 |
| EP | 1381163 A1 * | 1/2004 |

* cited by examiner

Primary Examiner—William D. Cumming
(74) Attorney, Agent, or Firm—Lee & Morse, P.C.

(57) ABSTRACT

A multi-band radio frequency (RF) receiving method in a mobile communication system having a reduced size and cost includes receiving RF wave signals for four or more non-overlapping bands, primarily filtering a first wide band including adjacent first and second bands and a second wide band including adjacent third and fourth bands from the received RF wave signals, low-noise amplifying the RF wave signals of the first and second wide bands, respectively, secondarily filtering a third wide band including adjacent second and third bands and a fourth wide band including first and fourth bands from the low-noise amplified RF wave signals of the first and second wide bands, generating two band RF wave signals to be simultaneously received, and frequency-down converting the two band RF wave signals generated in the secondary filtering step into two band intermediate frequency wave signals by means of first and second oscillation frequencies.

15 Claims, 8 Drawing Sheets

MULTI-BAND RF RECEIVING METHOD AND APPARATUS IN MOBILE COMMUNICATION SYSTEM

BACKGROUND OF THE INVENTION

1. Field of the Invention

The present invention relates to a multi-band radio frequency (RF) receiving method and apparatus in a mobile communication system. More particularly, the present invention relates to an RF receiving method and apparatus capable of simultaneously receiving two frequency bands among a plurality of received frequency bands and capable of reducing numbers of RF filters and local oscillators required for converting an RF wave signal into an intermediate frequency (IF) signal, thereby remarkably reducing system size and cost.

2. Description of the Related Art

Recently, as wireless portable terminals have become miniaturized and lightweight, and fabrication and architecture technologies of semiconductors have advanced, there has been an increasing demand for integrating various components for mobile communications into a single chip to minimize space occupied by the components. According to such a tendency of one-chip component integration, RF receiving apparatuses are also integrated into one-chip components in view of a low-noise amplifier, mixer or local oscillator. However, since it is very difficult to implement an on-chip RF filter having adequate characteristics by existing technology, the RF filter is mounted on an RF receiving apparatus in an off-chip type.

The RF filter is used to select a frequency signal corresponding to each band in an RF receiving apparatus for a wireless portable terminal. The RF filter includes a first filter and a second filter. The first filter receives a desired frequency band signal from a plurality of frequency band signals received via an antenna, and removes unnecessary signal components to prevent saturation of a low-noise amplifier. The second filter removes unnecessary signal components such as image components.

As described above, the module size and cost of an RF receiving apparatus are mostly attributed to the RF filters mounted as off-chip discrete components. Thus, in order to realize a miniaturized, low-cost module, it is necessary to reduce the required number of RF filters while maintaining the same level of RF filtering performance.

SUMMARY OF THE INVENTION

In an effort to solve the problems described above, the present invention provides a multi-band RF receiving method and apparatus in a mobile communication system, capable of noticeably reducing the number of RF filters and local oscillators required by employing a wide bandpass filter for simultaneously filtering two frequency bands and a low-noise amplifier for low-noise amplifying the filtered two frequency bands.

The present invention also provides a multi-band RF receiving method and apparatus in a mobile communication system capable of simultaneously selectively receiving two among four or more bands received from an antenna.

In accordance with a feature of an embodiment of the present invention, there is provided a multi-band radio frequency (RF) receiving method in a mobile communication system, the method including receiving RF wave signals for four or more non-overlapping bands, primarily filtering a first wide band including first and second bands adjacent to each other and a second wide band including third and fourth bands adjacent to each other from the received RF wave signals, low-noise amplifying the RF wave signals of the first and second wide bands, respectively, secondarily filtering a third wide band including second and third bands adjacent to each other and a fourth wide band including first and fourth bands from the low-noise amplified RF wave signals of the first and second wide bands, and generating two band RF wave signals to be simultaneously received, and frequency-down converting the two band RF wave signals generated in the secondarily filtering step into two band intermediate frequency (IF) wave signals by means of first and second oscillation frequencies.

According to another feature of an embodiment of the present invention, there is provided a multi-band RF receiving apparatus in a mobile communication system, including an antenna portion for receiving RF wave signals for four or more non-overlapping bands, a first filtering portion for filtering a first wide band including first and second bands adjacent to each other and a second wide band including third and fourth bands adjacent to each other from the RF wave signals received from the antenna portion, an amplifying portion for low-noise amplifying first and second wide band RF wave signals supplied from the first filtering portion, respectively, a second filtering portion for filtering a third wide band including second and third bands adjacent to each other and a fourth wide band including first and fourth bands from the first and second wide band RF wave signals received from the amplifying portion, a path setting portion disposed between the amplifying portion and the second filtering portion, and setting a path between the output port of the amplifying portion and the input port of the second filtering portion according to two bands selected to be simultaneously received among the first through fourth bands, and a frequency-down converting portion for converting the two band RF wave signals generated in the second filtering portion into two band IF wave signals by means of first and second oscillation frequencies.

The apparatus may further include a mode signal generator for generating first through fourth mode signals according to the two bands selected to be simultaneously received among the first through fourth bands.

In the apparatus, the first filtering portion may include a first bandpass filter for filtering the RF wave signals received in the antenna portion, and generating the first wide band having the first and second bands adjacent to each other, and a second bandpass filter for filtering the RF wave signals received in the antenna portion, and generating the second wide band having the third and fourth bands adjacent to each other.

The amplifying portion of the apparatus may include a first low-noise amplifier for amplifying the output of the first bandpass filter, and a second low-noise amplifier for amplifying the output of the second bandpass filter.

The second filtering portion of the apparatus preferably includes a third bandpass filter for filtering the RF wave signals provided from the path setting portion and generating the third wide band having the second and third bands, and a bandstop filter for filtering the RF wave signals provided from the path setting portion and generating the fourth wide band having the first and fourth bands.

The path setting portion of the apparatus preferably includes a first switch for switching the RF wave signal of the first wide band output from the first bandpass filter and outputting the same to one of the third bandpass filter and the bandstop filter, and a second switch for switching the RF wave signal of the second wide band output from the second bandpass filter and outputting the same to one of the third bandpass filter and the bandstop filter.

The frequency down-converting portion of the apparatus preferably includes an oscillating portion including a first oscillator for generating a first oscillation frequency and a second oscillator for generating a second oscillation frequency, a mixing portion including first through fourth mixers for obtaining differences between outputs of the third bandpass filter and the bandstop filter and outputs of the first and second oscillators, and a third filtering portion including fifth through eighth bandpass filters for filtering the outputs of the first through fourth mixers and generating IF wave signals of the first through fourth bands.

In the above method and apparatus, the first oscillation frequency is preferably the intermediate frequency of the first and second bands, and the second oscillation frequency is preferably the intermediate frequency of the third and fourth bands.

Finally, the first through fourth bands may be bands for a Global Positioning System (GPS), Distributed Control System (DCS), Wideband-Code Division Multiple Access (W-CDMA) and Industrial, Scientific and Medical (ISM) 2400 for wireless LAN, respectively, the first through fourth bands are bands for Personal Digital Cellular (PDC) 1500, DCS, W-CDMA and ISM2400, respectively, or for PDC1500, Personal Communications Systems (PCS), W-CDMA and ISM2400, respectively, or for PDC1500, Digital Enhanced Cordless Telecommunications (DECT), W-CDMA and ISM2400, respectively.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF THE INVENTION

Korean Patent Application No. 2002-40672, filed Jul. 12, 2002, and entitled: "Multi-Band RF Receiving Method and Apparatus in Mobile Communication System," is incorporated by reference herein in its entirety.

The present invention will now be described more fully hereinafter with reference to the accompanying drawings, in which preferred embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
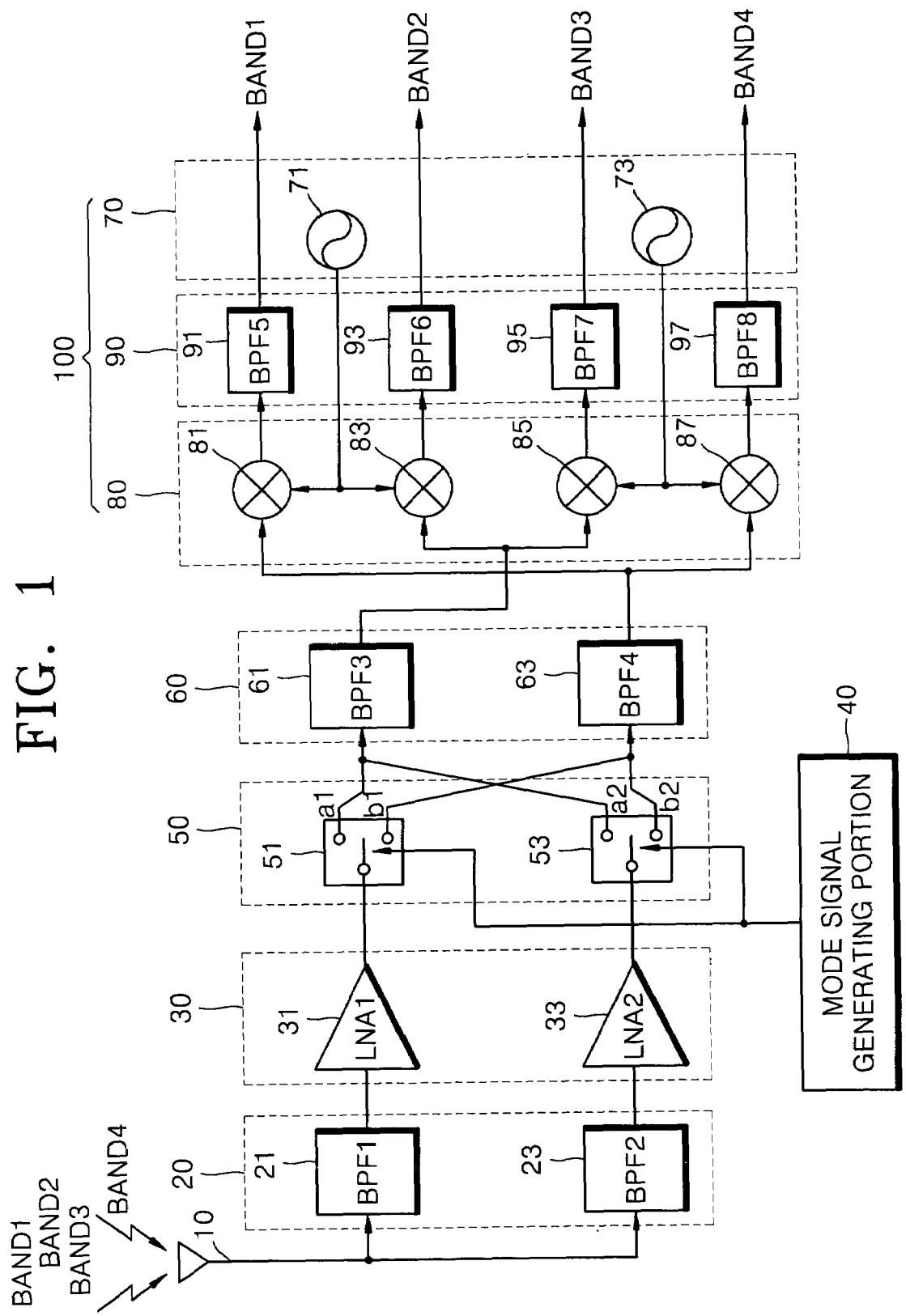
FIG. 1 is a block diagram of a multi-band RF receiving apparatus for a mobile communication system according to the present invention.

FIG. 1 is a block diagram of a multi-band RF receiving apparatus for a mobile communication system according to the present invention. The multi-band RF receiving apparatus includes an antenna portion 10, a first filtering portion 20, an amplifying portion 30, a mode signal generating portion 40, a second filtering portion 60, a path setting portion 50, and a frequency down-converting portion 100. The antenna portion 10 receives RF wave signals for four or more non-overlapping bands. The first filtering portion 20 filters a first wide band including first and second bands and a second wide band including third and fourth bands from the RF wave signals received from the antenna portion 10. The amplifying portion 30 low-noise amplifies first and second wideband RF wave signals supplied from the first filtering portion 20. The mode signal generating portion 40 generates first through fourth mode signals according to two bands selected to be simultaneously received among the first through fourth bands. The second filtering portion 60 filters a third wide band including second and third bands and a fourth wide band including first and fourth bands from the first and second wide band RF wave signals received from the amplifying portion 30. The path setting portion 50 is disposed between the amplifying portion 30 and the second filtering portion 60, and sets a path between the output port of the amplifying portion 30 and the input port of the second filtering portion 60 according to two bands to be simultaneously received among the first through fourth bands. The frequency-down converting portion 100 converts the two band RF wave signals generated in the second filtering portion 60 into IF wave signals by means of first and second oscillation frequencies. The frequency down-converting portion 100 includes an oscillating portion 70, a mixing portion 80 and a third filtering portion 90.

The first filtering portion 20 includes a first bandpass filter 21 BPF1 for filtering the RF wave signals received in the antenna portion 10 and generating RF wave signals of the first wide band having the first and second bands, and a second bandpass filter 23 BPF2 for filtering the RF wave signals received in the antenna portion 10 and generating RF wave signals of the second wide band having the third and fourth bands. The amplifying portion 30 includes first and second low-noise amplifiers 31 LNA1 and 33 LNA2 for amplifying outputs of the first and second bandpass filters 21 BPF1 and 23 BPF2.

The path setting portion 50 includes a first switch 51 and a second switch 53. The first switch 51 has a first upper contact a1 connected to the input port of a third bandpass filter 61 BPF3, and a first lower contact b1 connected to the input port of a bandstop filter 63 BPF4. The second switch 53 has a second upper contact a2 connected to the input port of the third bandpass filter 61 BPF3, and a second lower contact b2 connected to the input port of the bandstop filter 63 BPF4.

The second filtering portion 60 includes the third bandpass filter 61 BPF3 for filtering RF wave signals of the first and/or second wide bands provided from the first and/or second switches 51 and/or 53 and generating the RF wave signals of the third wide band having the second and third bands, and the bandstop filter 63 BPF4 for filtering RF wave signals of the first and/or second wide bands provided from the first and/or second switches 51 and/or 53 and generating the RF wave signals of the fourth wide band having the first and fourth bands by restricting second and third bands.

The oscillating portion 70 includes a first oscillator 71 for generating a first oscillation frequency and a second oscillator 73 for generating a second oscillation frequency. The first oscillation frequency is the intermediate frequency of the first and second bands, and the second oscillation frequency is the intermediate frequency of the third and fourth bands.

The mixing portion 80 includes a first mixer 81, a second mixer 83, a third mixer 85 and a fourth mixer 87. The first mixer 81 obtains a difference between an output of the bandstop filter 63 BPF4 and the first oscillation frequency generated in the first oscillator 71. The second mixer 83 obtains a difference between an output of the third bandpass filter 61 BPF3 and the first oscillation frequency generated in the first oscillator. The third mixer 85 obtains a difference between an output of the third bandpass filter 61 BPF3 and the second oscillation frequency generated in the second oscillator 73. The fourth mixer 87 obtains a difference between an output of the bandstop filter 63 BPF4 and the second oscillation frequency generated in the second oscillator 73.

The third filtering portion 90 includes fifth through eighth bandpass filters 91 BPF5, 93 BPF6, 95 BPF7 and 97 BPF8 for filtering the outputs of the first through fourth mixers 81, 83, 85 and 87, respectively, and respectively generating IF wave signals of the first through fourth bands.

The operation of the above-described RF receiving apparatus will now be described with reference to FIGS. 1 through 6.

The antenna portion 10 receives RF wave signals of the first through fourth bands transmitted from different base stations of first through fourth mobile communication systems, the frequency bands not overlapping with one another. For the sake of convenient explanation, as shown in FIG. 1, the present invention is herein described with the antenna portion 10 receiving RF wave signals from an exemplary four bands. However, as is evident to one of ordinary skill in the art, the antenna portion 10 is not limited to receiving signals from four bands, and may receive signals from four or more bands.

In the first filtering portion 20, the first bandpass filter 21 BPF1 receives RF wave signals received from the antenna portion 10, filters the received RF wave signals, and generates a first wide band having the first and second bands adjacent to each other with unnecessary components removed therefrom. Likewise, the second bandpass filter 23 BPF2 receives RF wave signals of the first through fourth bands received from the antenna portion 10, filters the received RF wave signals, and generates a second wide band having the third and fourth bands adjacent to each other with unnecessary components removed therefrom.

In the amplifying portion 30, the first low-noise amplifier 31 LNA1 low-noise amplifies and outputs the RF wave signal of the first wide band output from the first bandpass filter 21 BPF1, and the second low-noise amplifier 33 LNA2 low-noise amplifies and outputs the RF wave signal of the second wide band output from the second bandpass filter 23 BPF2.

The mode signal generating portion 40 generates first through fourth mode signals and outputs the same to the path setting portion 50, for switching operation of the first and second switches 51 and 53. That is, the mode signal generating portion 40 outputs the first through fourth mode signals to the path setting portion 50 for controlling setting paths between the output ports of the first and second low-noise amplifiers 31 and 33 and the input ports of the third bandpass filter 61 BPF3 and the bandstop filter 63 BPF4.

In the path setting portion 50, if the first mode signal is applied thereto from the mode signal generating portion 40 as a switching control signal, the first switch 51 is connected to the first upper contact a1 and the second switch 53 is connected to the second upper contact a2. If the second mode signal is applied to the path setting portion 50, the first switch 51 is connected to the first upper contact a1 and the second switch 53 is connected to the second lower contact b2. If the third mode signal is applied to the path setting portion 50, the first switch 51 is connected to the first lower contact b1 and the second switch 53 is connected to the second lower contact b2. If the fourth mode signal is applied to the path setting portion 50, the first switch 51 is connected to the first lower contact b1 and the second switch 53 is connected to the second upper contact a2. Consequently, in order to receive the RF wave signals of the second and third bands, the first mode signal is applied from the mode signal generating portion 40. In order to receive the RF wave signals of the second and fourth bands, the second mode signal is applied from the mode signal generating portion 40. In order to receive the RF wave signals of the first and fourth bands, the third mode signal is applied from the mode signal generating portion 40. In order to receive the RF wave signals of the first and third bands, the fourth mode signal is applied from the mode signal generating portion 40.

In the second filtering portion 60, the third bandpass filter 61 BPF3 receives RF wave signals switched by and output from the first and second switches 51 and 53, filters the received RF wave signals, and generates the RF wave signals of the third wide band having the second and third bands with unnecessary components removed therefrom. Likewise, the bandstop filter 63 BPF4 receives RF wave signals switched by and output from the first and second switches 51 and 53, and filters the received RF wave signals, and generates the RF wave signals of the fourth wide band having the first and fourth bands with unnecessary components removed therefrom.

In the oscillating portion 70 for outputting oscillation frequencies corresponding to received RF wave signals, the intermediate frequency of two adjacent bands is set as an oscillation frequency. That is to say, the intermediate frequency of the first and second bands corresponds to the first oscillation frequency of the first local oscillator 71, and the intermediate frequency of the third and fourth bands corresponds to the second oscillation frequency of the second local oscillator 73.

In the mixing portion 80, the first mixer 81 obtains a difference between the RF wave signal(s) of the first and/or fourth band output from the bandstop filter 63 BPF4 and the first oscillation frequency of the first local oscillator 71 and outputs the obtained difference to the fifth bandpass filter 91 BPF5. The second mixer 83 obtains a difference between the RF wave signal(s) of the second and/or third band output from the third bandpass filter 61 BPF3 and the first oscillation frequency of the first local oscillator 71 and outputs the obtained difference to the sixth bandpass filter 93 BPF6. The third mixer 85 obtains a difference between the RF wave signal(s) of the second and/or third band output from the third bandpass filter 61 BPF3 and the second oscillation frequency of the second local oscillator 73 and outputs the obtained difference to the seventh bandpass filter 95 BPF7. The fourth mixer 87 obtains a difference between the RF wave signal(s) of the first and/or fourth bands output from the bandstop filter 63 BPF4 and the second oscillation frequency of the second local oscillator 73 and outputs the obtained difference to the eighth bandpass filter 97 BPF8.

In the third filtering portion 90, the fifth through eighth bandpass filters 91, 93, 95 and 97 BPF5 through BPF8 perform bandpass filtering of outputs of the first through fourth mixers 81, 83, 85 and 87, and generate IF wave signals of the first through fourth bands, respectively.

Even if the first through third bandbpass filters 21 BPF1, 23 BPF2 and 61 BPF3, and the bandstop filter 63 BPF 4, are implemented as wide bandpass and bandstop filters, the RF receiver is still not affected by adjacent band noise because cut off characteristics of wide bandpass and bandstop filters are nearly the same as cut off characteristics of conventional bandpass and bandstop filters.

Referring to FIGS. 2 through 5, the operations of the path setting portion 50, the second filtering portion 60, the mixing portion 80 and the third filtering portion 90 will be described according to the first through fourth mode signals output from the mode signal generating portion 40.

Figure 2:
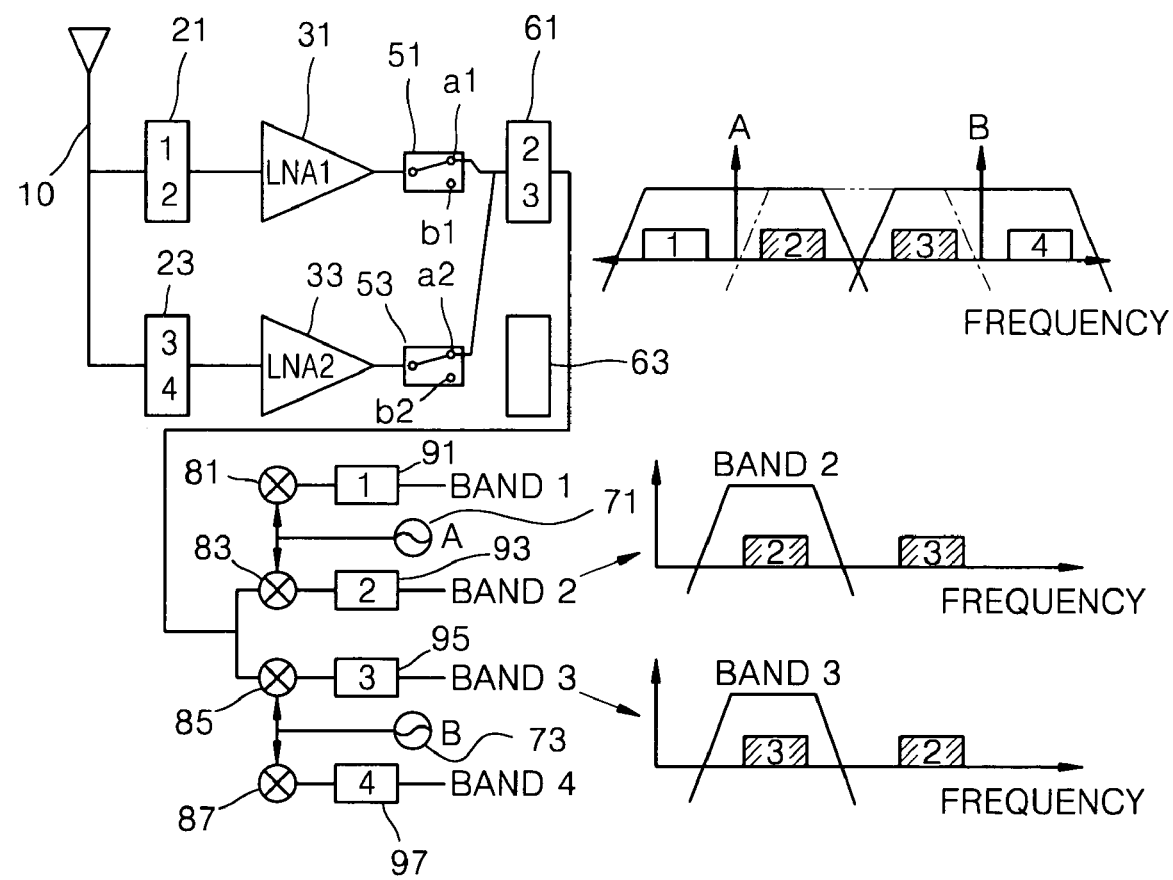
FIG. 2 illustrates the operation of various components of the multi-band RF receiving apparatus shown in FIG. 1, and final output frequency bands in a case in which a first mode is selected.

Referring to FIG. 2, if the first mode signal is generated, the first switch 51 is connected to the first upper contact a1 and the second switch 53 is connected to the second upper contact a2. Thus, the RF wave signals of the first and second bands output from the first switch 51 and the RF wave signals of the third and fourth bands output from the second switch 53 are input to the third bandpass filter 61 BPF3. The third bandpass filter 61 BPF3 filters the first through fourth band RF wave signals provided from the first and second switches 51 and 53, and applies the filtered second and third bands to the second and third mixers 83 and 85. The second mixer 83 obtains differences between the RF wave signals of the second and third bands and the first oscillation frequency (A) and outputs the obtained differences to the sixth bandpass filter 93 BPF6. The third mixer 85 obtains differences between the RF wave signals of the second and third bands and the second oscillation frequency (B) and outputs the obtained differences to the seventh bandpass filter 95 BPF7. As a result, the sixth bandpass filter 93 BPF6 filters the output from the second mixer 83 and outputs the filtered IF wave signal of the second band and the seventh bandpass filter 95 BPF7 filters the output from the third mixer 85 and outputs the filtered IF wave signal of the third band.

Figure 3:
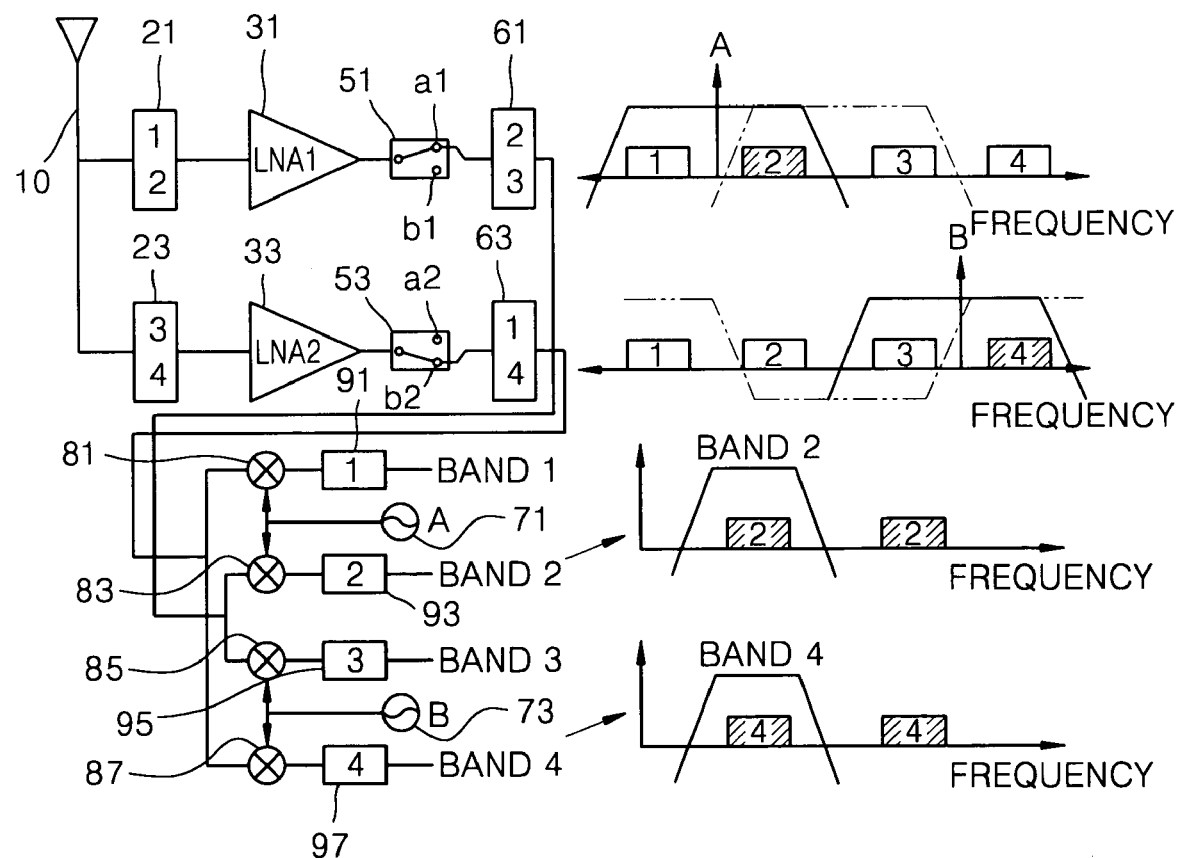
FIG. 3 illustrates the operation of various components of the multi-band RF receiving apparatus shown in FIG. 1, and final output frequency bands, in a case in which a second mode is selected.

Referring to FIG. 3, if the second mode signal is generated, the first switch 51 is connected to the first upper contact a1 and the second switch 53 is connected to the second lower contact b2. Thus, the RF wave signals of the first and second bands output from the first switch 51 are input to the third bandpass filter 61 BPF3. The RF wave signals of the third and fourth bands output from the second switch 53 are input to the bandstop filter 63 BPF4. The third bandpass filter 61 BPF3 filters the first and second band RF wave signals provided from the first switch 51 and applies the filtered second band to the second and third mixers 83 and 85. The bandstop filter 63 BPF4 filters the third and fourth band RF wave signals provided from the second switch 53, and applies the filtered fourth band to the first and fourth mixers 81 and 87. The first mixer 81 obtains a difference between the RF wave signal of the fourth band and the first oscillation frequency (A) and outputs the obtained difference to the fifth bandpass filter 91 BPF5. The second mixer 83 obtains a difference between the RF wave signal of the second band and the first oscillation frequency (A) and outputs the obtained difference to the sixth bandpass filter 93 BPF6. The third mixer 85 obtains a difference between the RF wave signal of the second band and the second oscillation frequency (B) and outputs the obtained difference to the seventh bandpass filter 95 BPF7. The fourth mixer 87 obtains a difference between the RF wave signal of the fourth band and the second oscillation frequency (B) and outputs the obtained difference to the eighth bandpass filter 97 BPF8.

At this time, the fourth band IF wave signal provided from the first mixer 81 is blocked because it is out of a band of the fifth bandpass filter 91 BPF5. Also, the second band IF wave signal provided from the third mixer 85 is blocked because it is out of a band of the seventh bandpass filter 95 BPF7. As a result, the sixth bandpass filter 93 BPF6 filters the output from the second mixer 83 and outputs the filtered second band IF wave signal, and the eighth bandpass filter 97 BPF8 filters the output from the fourth mixer 87 and outputs the filtered fourth band IF wave signal.

Figure 4:
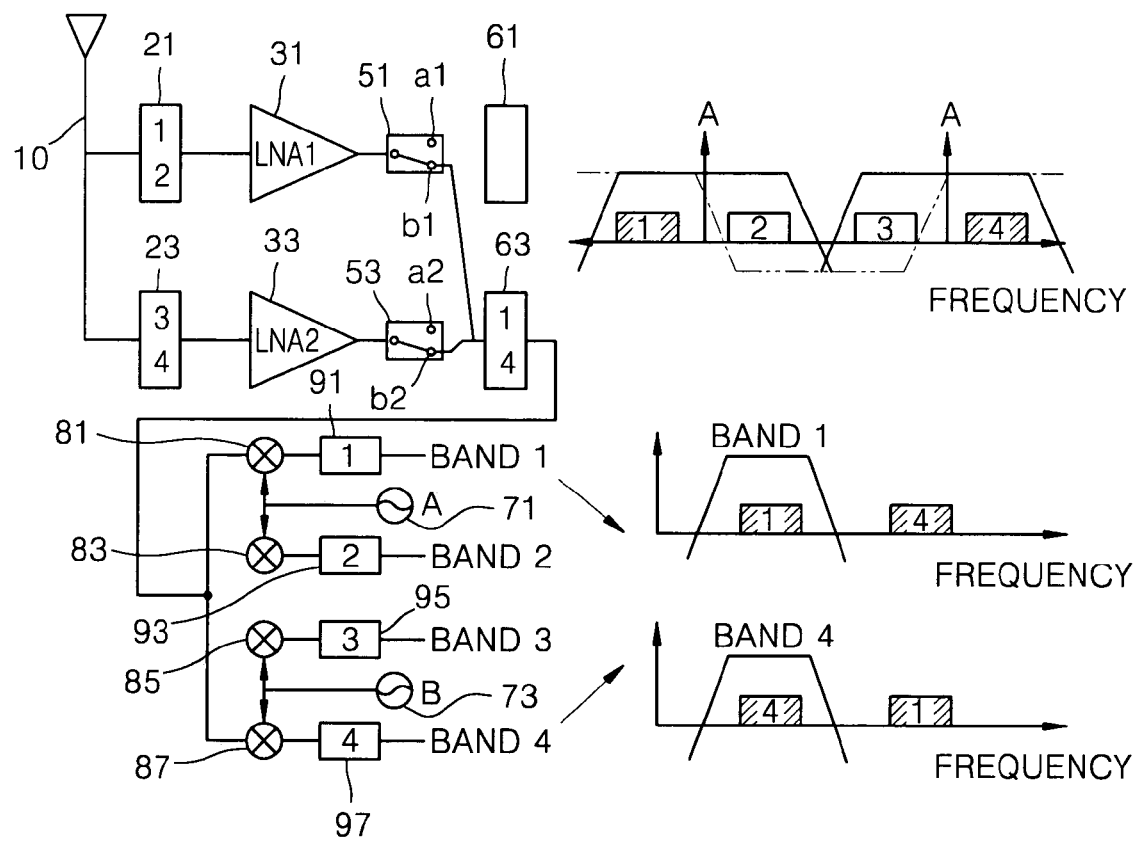
FIG. 4 illustrates the operation of various components of the multi-band RF receiving apparatus shown in FIG. 1, and final output frequency bands, in a case in which a third mode is selected.

Referring to FIG. 4, if the third mode signal is generated, the first switch 51 is connected to the first lower contact b1 and the second switch 53 is connected to the second lower contact b2. Thus, the RF wave signals of the first and second bands output from the first switch 51 and the RF wave signals of the third and fourth bands output from the second switch 53 are input to the bandstop filter 63 BPF4. The bandstop filter 63 BPF4 filters the first through fourth band RF wave signals provided from the first and second switches 51 and 53, and applies the filtered first and fourth bands to the first and fourth mixers 81 and 87. The first mixer 81 obtains differences between the RF wave signals of the first and fourth bands and the first oscillation frequency (A) and outputs the obtained differences to the fifth bandpass filter 91 BPF5. The fourth mixer 87 obtains differences between the RF wave signals of the first and fourth bands and the second oscillation frequency (B) and outputs the obtained differences to the eighth bandpass filter 97 BPF8. As a result, the fifth bandpass filter 91 BPF5 filters the output from the first mixer 81 and outputs the filtered first band IF wave signal, and the eighth bandpass filter 97 BPF8 filters the output from the fourth mixer 87, and outputs the filtered the fourth band IF wave signal.

Figure 5:
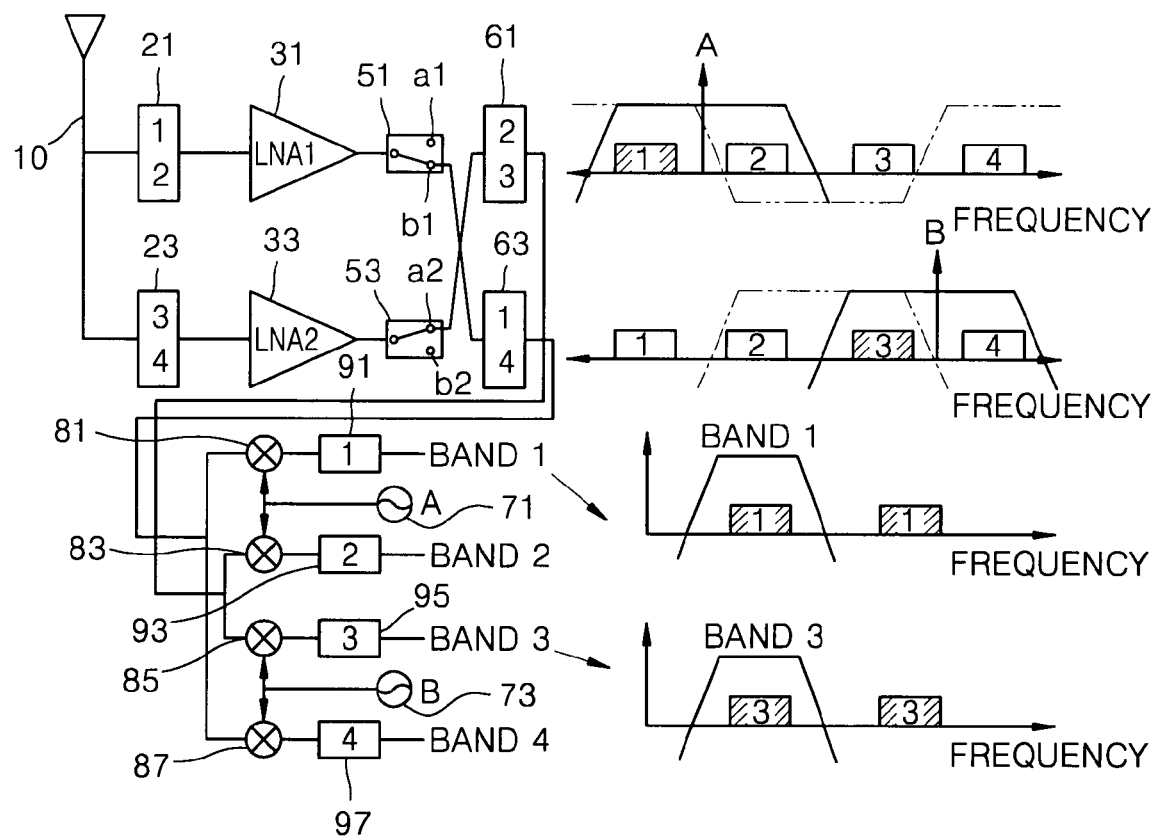
FIG. 5 illustrates the operation of various components of the multi-band RF receiving apparatus shown in FIG. 1, and final output frequency bands, in a case in which a fourth mode is selected.

Referring to FIG. 5, if the fourth mode signal is generated, the first switch 51 is connected to the first lower contact b1 and the second switch 53 is connected to the second upper contact a2. Thus, the RF wave signals of the first and second bands output from the first switch 51 are input to the bandstop filter 63 BPF4. The RF wave signals of the third and fourth bands output from the second switch 53 are input to the third bandpass filter 61 BPF3. The third bandpass filter 61 BPF3 filters the third and fourth band RF wave signals and applies the filtered third band to the second and third mixers 83 and 85. The bandstop filter 63 BPF4 filters the first and second band RF wave signals and applies the filtered first band to the first and fourth mixers 81 and 87. The first mixer 81 obtains a difference between the RF wave signal of the first band and the first oscillation frequency (A) and outputs the obtained difference to the fifth bandpass filter 91 BPF5. The second mixer 83 obtains a difference between the RF wave signal of the third band and the first oscillation frequency (A) and outputs the obtained difference to the sixth bandpass filter 93 BPF6. The third mixer 85 obtains a difference between the RF wave signal of the third band and the second oscillation frequency (B) and outputs the obtained difference to the seventh bandpass filter 95 BPF7. The fourth mixer 87 obtains a difference between the RF wave signal of the first band and the second oscillation frequency (B) and outputs the obtained difference to the eighth bandpass filter 97 BPF8.

At this time, the third band IF wave signal provided from the second mixer 83 is blocked because it is out of a band of the sixth bandpass filter 93 BPF6. Also, the first band IF wave signal provided from the fourth mixer 87 is blocked because it is out of a band of the eighth bandpass filter 97 BPF8. As a result, the fifth bandpass filter 91 BPF6 filters the output from the first mixer 81 and outputs the filtered first band IF wave signal, and the seventh bandpass filter 95 BPF7 filters the output from the third mixer 85 and outputs the filtered third band IF wave signal.

In an embodiment of the present invention, an example of an RF receiving apparatus will now be described, the apparatus using a Global Positioning System (GPS), Distributed Control System (DCS), Wideband-Code Division Multiple Access (W-CDMA) or Industrial, Scientific and Medical (ISM) 2400 for wireless LAN, which are necessary for European mobile communication terminals, as first through fourth bands.

Figure 6:
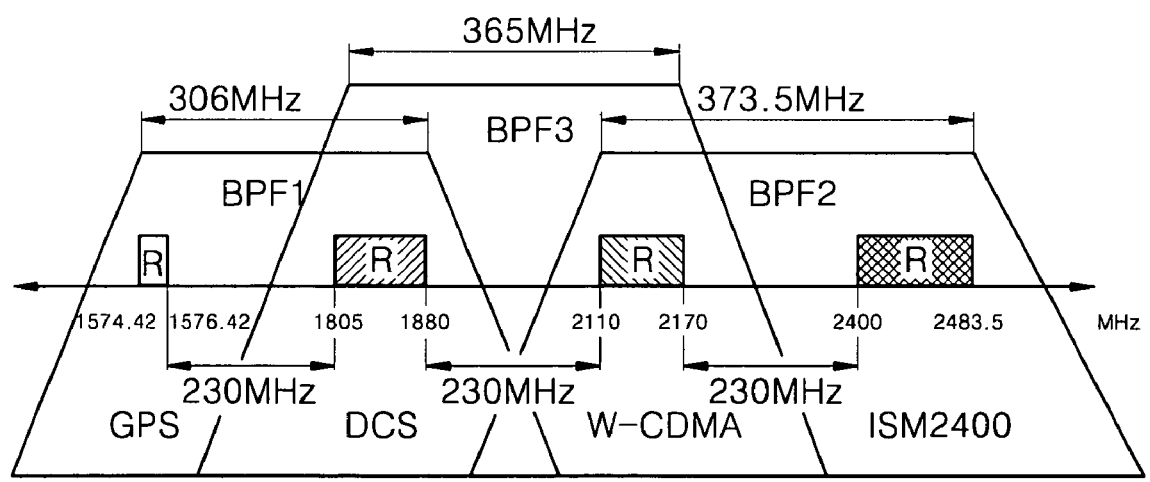
FIG. 6 illustrates an example of first through fourth frequency bands shown in FIG. 1 and required characteristics of a wide bandpass filter corresponding thereto.
Figure 7:
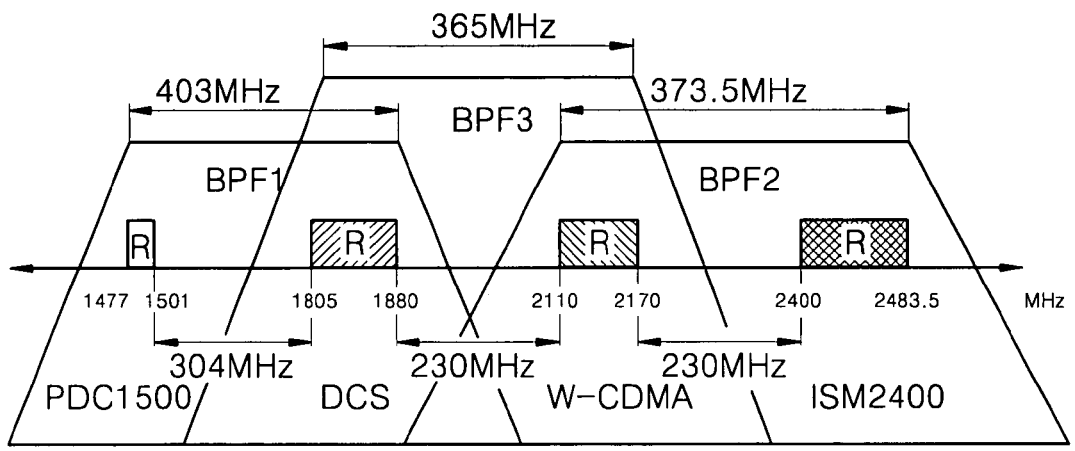
FIGS. 7 through 10 illustrate a variety of examples of first through fourth frequency bands shown in FIG. 1 and required characteristics of a wide bandpass filter corresponding thereto.
Figure 8:
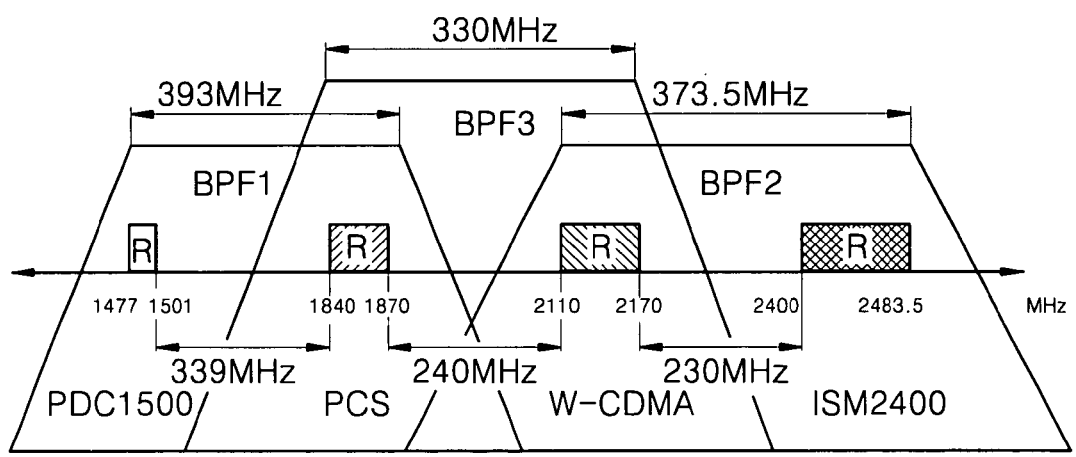
Figure 9:
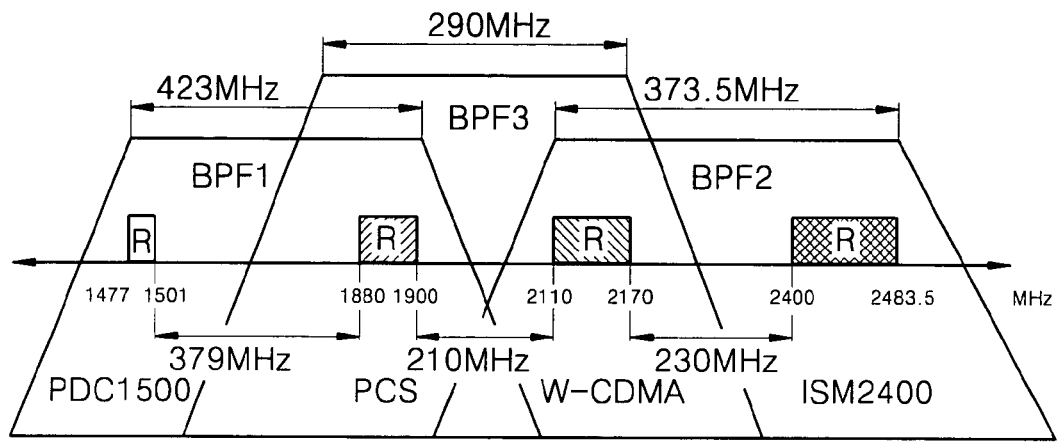
Figure 10:
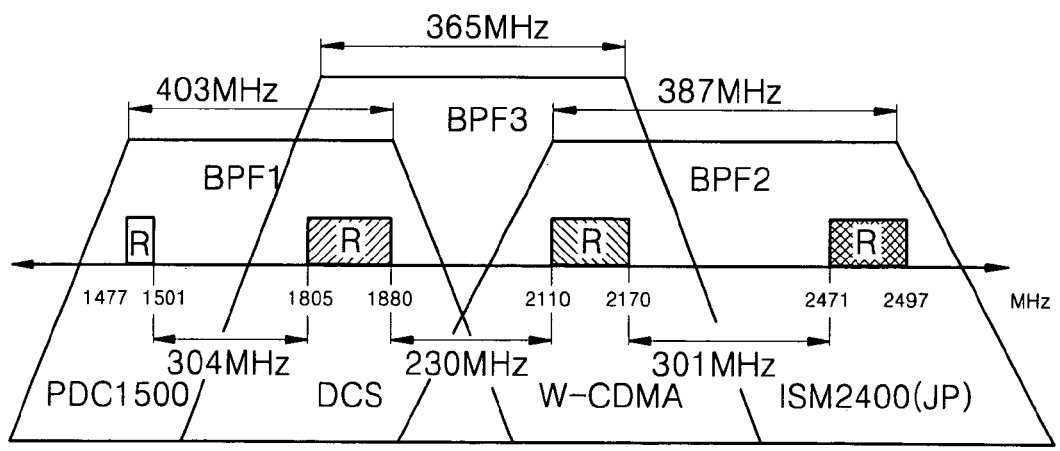

Referring to FIG. 6, the GPS has a bandwidth of 2 MHz at a frequency of 1574.42 to 1576.42 MHz, the DCS has a bandwidth of 75 MHz at a frequency of 1805 to 1880 MHz, the W-CDMA has a bandwidth of 60 MHz at a frequency of 2110 to 2170 MHz, and the ISM2400 has a bandwidth of 83.5 MHz at a frequency of 2400 to 2483.5 MHz. The respective bands are spaced apart from each other by a bandwidth of 230 MHz.

Accordingly, the first bandpass filter 21 BPF1 is designed to have a center frequency of 1727.21 MHz and a bandwidth of 306 MHz and to be attenuated by at least 30 dB at a frequency of the center frequency ±383 MHz. The second bandpass filter 23 BPF2 is designed to have a center frequency of 2296.75 MHz and a bandwidth of 375.3 MHz and to be attenuated by at least 30 dB at a frequency of the center frequency 417 MHz. The third bandpass filter 61 BPF3 is designed to have a center frequency of 1987.5 MHz and a bandwidth of 365 MHz and to be attenuated by at least 30 dB at a frequency of the center frequency ±412 MHz. The bandstop filter 63 BPF4 is designed to have bandstop characteristics at the same center frequency and the same bandwidth as those of the third bandpass filter 61 BPF3. The first and second local oscillators 71 and 73 are designed such that first and second oscillation frequencies thereof are 1690 MHz, which is the intermediate frequency of GPS and DSC, and 2285 MHz, which is the intermediate frequency of W-CDMA and ISM2400, respectively.

Alternatively, as shown in FIGS. 7 through 10 respectively, in cases where sets of Personal Digital Cellular (PDC) 1500, DCS, W-CDMA and ISM2400; PDC1500, Personal Communications Systems (PCS), W-CDMA and ISM2400; PDC1500, Digital Enhanced Cordless Telecommunications (DECT), W-CDMA and ISM2400; and PDC 1500, DCS, W-CDMA and ISM2400 (JP), are used as the first through fourth bands, the invention is easily implemented by adjusting the bands and bandwidths of the respective bandpass and bandstop filters, and the oscillation frequencies of the local oscillators.

As described above, compared to the conventional multi-band RF receiving apparatus for a mobile communication system, the multi-band RF receiving apparatus according to the present invention requires half as many RF filters prior to the use of mixers and local oscillators. As a result, the size and cost of the RF module are noticeably reduced, while capabilities of removing image components and preventing saturation of a low-noise amplifier by receiving only desired frequencies and removing unnecessary frequencies are retained. Therefore, the multi-band RF receiving apparatus according to the present invention exhibits substantially the same performance in actual implementation as that of the conventional apparatus, but at a greatly reduced size and cost.

Further, in the multi-band RF receiving apparatus of the present invention, two bands among four or more multiple bands received from an antenna may be simultaneously selected, thereby allowing two different kinds of information to be simultaneously received.

Preferred embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A multi-band radio frequency (RF) receiving method in a mobile communication system, comprising:
   receiving RF wave signals for four or more non-overlapping bands;
   primarily filtering a first wide band including first and second bands adjacent to each other and a second wide band including third and fourth bands adjacent to each other from the received RF wave signals;
   low-noise amplifying the RF wave signals of the first and second wide bands, respectively;
   secondarily filtering a third wide band including second and third bands adjacent to each other and a fourth wide band including first and fourth bands from the low-noise amplified RF wave signals of the first and second wide bands, and generating two band RF wave signals to be simultaneously received; and
   frequency-down converting the two band RF wave signals generated in the secondarily filtering step into two band intermediate frequency (IF) wave signals by means of first and second oscillation frequencies.

2. The method as claimed in claim 1, wherein the first oscillation frequency is the intermediate frequency of the first and second bands, and the second oscillation frequency is the intermediate frequency of the third and fourth bands.

3. A multi-band RF receiving apparatus in a mobile communication system, comprising:
   an antenna portion for receiving RF wave signals for four or more non-overlapping bands;
   a first filtering portion for filtering a first wide band including first and second bands adjacent to each other and a second wide band including third and fourth bands adjacent to each other from the RF wave signals received from the antenna portion;
   an amplifying portion for low-noise amplifying first and second wide band RF wave signals supplied from the first filtering portion, respectively;
   a second filtering portion for filtering a third wide band including second and third bands adjacent to each other and a fourth wide band including first and fourth bands from the first and second wide band RF wave signals received from the amplifying portion;
   a path setting portion disposed between the amplifying portion and the second filtering portion, and setting a path between the output port of the amplifying portion and the input port of the second filtering portion according to two bands selected to be simultaneously received among the first through fourth bands; and a frequency-down converting portion for converting the two band RF wave signals generated in the second filtering portion into two band IF wave signals by means of first and second oscillation frequencies.

4. The apparatus as claimed in claim 3, further comprising a mode signal generator for generating first through fourth mode signals according to the two bands selected to be simultaneously received among the first through fourth bands.

5. The apparatus as claimed in claim 3, wherein the first oscillation frequency is the intermediate frequency of the first and second bands, and the second oscillation frequency is the intermediate frequency of the third and fourth bands.

6. The apparatus as claimed in claim 3, wherein the first filtering portion includes a first bandpass filter for filtering the RF wave signals received in the antenna portion, and generating the first wide band having the first and second bands adjacent to each other, and a second bandpass filter for filtering the RF wave signals received in the antenna portion, and generating the second wide band having the third and fourth bands adjacent to each other.

7. The apparatus as claimed in claim 6, wherein the amplifying portion includes a first low-noise amplifier for amplifying the output of the first bandpass filter, and a second low-noise amplifier for amplifying the output of the second bandpass filter.

8. The apparatus as claimed in claim 3, wherein the second filtering portion includes a third bandpass filter for filtering the RF wave signals provided from the path setting portion and generating the third wide band having the second and third bands, and a bandstop filter for filtering the RF wave signals provided from the path setting portion and generating the fourth wide band having the first and fourth bands.

9. The apparatus as claimed in claim 8, wherein the path setting portion includes a first switch for switching the RF wave signal of the first wide band output from the first bandpass filter and outputting the same to one of the third bandpass filter and the bandstop filter, and a second switch for switching the RF wave signal of the second wide band output from the second bandpass filter and outputting the same to one of the third bandpass filter and the bandstop filter.

10. The apparatus as claimed in claim 9, wherein the frequency down-converting portion comprises:

an oscillating portion including a first oscillator for generating a first oscillation frequency and a second oscillator for generating a second oscillation frequency;

a mixing portion including first through fourth mixers for obtaining differences between outputs of the third bandpass filter and the bandstop filter and outputs of the first and second oscillators; and a third filtering portion including fifth through eighth bandpass filters for filtering the outputs of the first through fourth mixers and generating IF wave signals of the first through fourth bands.

11. The apparatus as claimed in claim 10, wherein the first oscillation frequency is the intermediate frequency of the first and second bands, and the second oscillation frequency is the intermediate frequency of the third and fourth bands.

12. The apparatus as claimed in claim 3, wherein the first through fourth bands are bands for a Global Positioning System (GPS), Distributed Control System (DCS), Wideband-Code Division Multiple Access (W-CDMA) and Industrial, Scientific and Medical (ISM) 2400 for wireless LAN, respectively.

13. The apparatus as claimed in claim 3, wherein the first through fourth bands are bands for Personal Digital Cellular (PDC) 1500, DCS, W-CDMA and ISM2400, respectively.

14. The apparatus as claimed in claim 3, wherein the first through fourth bands are bands for PDC1500, Personal Communications Systems (PCS), W-CDMA and ISM2400, respectively.

15. The apparatus as claimed in claim 3, wherein the first through fourth bands are bands for PDC1500, Digital Enhanced Cordless Telecommunications (DECT), W-CDMA and ISM2400, respectively.

* * * * *